United States Patent
Hollis et al.

(10) Patent No.: US 9,524,763 B2
(45) Date of Patent: Dec. 20, 2016

(54) SOURCE-SYNCHRONOUS DATA TRANSMISSION WITH NON-UNIFORM INTERFACE TOPOLOGY

(71) Applicant: QUALCOMM Incorporated, San Diego, CA (US)

(72) Inventors: Timothy Mowry Hollis, Poway, CA (US); Michael Joseph Brunolli, Escondido, CA (US)

(73) Assignee: QUALCOMM Incorporated, San Diego, CA (US)

( * ) Notice: Subject to any disclaimer, the term of this patent is extended or adjusted under 35 U.S.C. 154(b) by 217 days.

(21) Appl. No.: 14/302,806

(22) Filed: Jun. 12, 2014

(65) Prior Publication Data

US 2015/0364171 A1    Dec. 17, 2015

(51) Int. Cl.
| | |
|---|---|
| G11C 7/22 | (2006.01) |
| G06F 13/42 | (2006.01) |
| G11C 5/06 | (2006.01) |
| G11C 7/02 | (2006.01) |
| G11C 7/10 | (2006.01) |
| G11C 11/4076 | (2006.01) |
| G11C 11/4096 | (2006.01) |
| G11C 29/02 | (2006.01) |
| H03K 19/0185 | (2006.01) |
| H04L 25/02 | (2006.01) |

(52) U.S. Cl.
CPC ........... *G11C 7/222* (2013.01); *G06F 13/4243* (2013.01); *G11C 5/063* (2013.01); *G11C 7/02* (2013.01); *G11C 7/1048* (2013.01); *G11C 7/1057* (2013.01); *G11C 7/1066* (2013.01); *G11C 7/1069* (2013.01); *G11C 7/1072* (2013.01); *G11C 7/1084* (2013.01); *G11C 7/1093* (2013.01); *G11C 11/4076* (2013.01); *G11C 11/4096* (2013.01); *G11C 29/022* (2013.01); *G11C 29/023* (2013.01); *G11C 29/028* (2013.01); *H03K 19/018521* (2013.01); *H03K 19/018528* (2013.01); *H03K 19/018557* (2013.01); *H04L 25/0278* (2013.01); *H04L 25/0298* (2013.01); *G11C 2207/105* (2013.01)

(58) Field of Classification Search
CPC .................. G11C 7/222; H03K 19/018521
USPC .................. 326/30, 83; 365/189.17; 710/305
See application file for complete search history.

(56) References Cited

U.S. PATENT DOCUMENTS

| | | |
|---|---|---|
| 7,251,740 B2 | 7/2007 | Newman |
| 8,565,032 B2 | 10/2013 | Abe |
| 2004/0100838 A1 | 5/2004 | Tamura et al. |
| 2004/0218434 A1 | 11/2004 | Hwang et al. |
| 2007/0217258 A1 | 9/2007 | Wang |
| 2008/0144405 A1 | 6/2008 | Teh et al. |

(Continued)

FOREIGN PATENT DOCUMENTS

EP    2575138 A2    4/2013

OTHER PUBLICATIONS

Application Note 3662, "Understanding LVDS Fail-Safe Circuits", Maxim integrated, Mar. 22, 2006, 7 pages.*

(Continued)

*Primary Examiner* — Daniel D Chang
(74) *Attorney, Agent, or Firm* — Haynes and Boone, LLP (57) ABSTRACT

A source-synchronous system is provided in which a non-uniform interface may exist in a data source endpoint as well as in a data sink endpoint.

12 Claims, 7 Drawing Sheets

(56) References Cited

U.S. PATENT DOCUMENTS

2008/0256281 A1* 10/2008 Fahr .................. G06F 13/16
                                                          710/305
2010/0061165 A1    3/2010 Cook
2010/0327902 A1   12/2010 Shau
2011/0057722 A1    3/2011 Komyo et al.
2011/0075496 A1    3/2011 Mueller
2012/0326746 A1   12/2012 Mccall et al.

OTHER PUBLICATIONS

International Search Report and Written Opinion—PCT/US2015/031147—ISA/EPO—Oct. 9, 2015.

* cited by examiner

SOURCE-SYNCHRONOUS DATA TRANSMISSION WITH NON-UNIFORM INTERFACE TOPOLOGY

TECHNICAL FIELD

This application relates to source-synchronous data transmission and reception over non-uniform interfaces.

BACKGROUND

In source-synchronous systems, a data source endpoint sends data through a data channel to a data sink endpoint. In addition, the data source endpoint transmits a data strobe (e.g., a clock signal) over a data strobe channel to the data sink endpoint. The data sink uses the clock to latch or register the received data. As compared to the use of a system clock for transferring data, source-synchronous systems typically achieve considerably higher data rates. In a single-data-rate-source-synchronous system, the data is latched at the data sink on just one clock edge such as the rising edge. But in a double-data-rate (DDR) source-synchronous system, the data is latched on both the rising and falling edges. DDR data transmission is thus twice as fast as single data rate transmission at the same data strobe frequency.

Because of this speed advantage, double data rate signaling standards such as LPDDR4 (Low Power Double Data Rate 4) are quite popular for the reading and writing of data. For example, a microprocessor may write to a memory such as a dynamic random access memory (DRAM) by transmitting both a DDR data strobe and a data signal. It is conventional for the data strobe and the data signal to be carried on balanced paths. Not only are the on and off-chip routes for the data strobe and the data matched but the circuitry within the paths such as the drivers and terminations are also matched.

Figure 1:
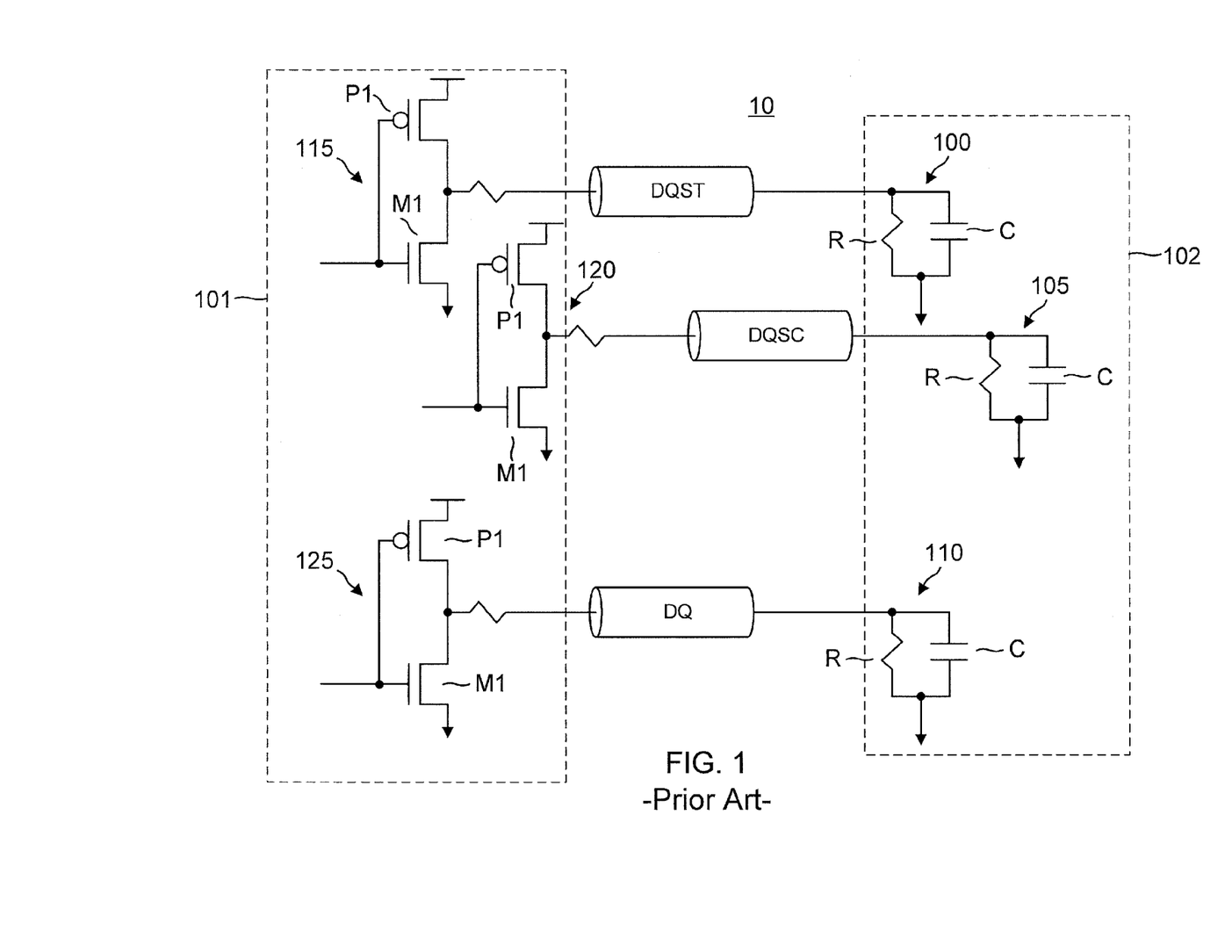
FIG. 1 is a circuit diagram of a conventional source-synchronous system.

An example source-synchronous system 10 including a data source endpoint 101 such as an SOC and a data sink endpoint 102 such as a dynamic random access memory is shown in FIG. 1. System 10 is a double-data-rate system such that data source 101 transmits both a true data strobe that propagates over a true data strobe channel (DQST) to data sink 102 as well as a complement data strobe that propagates through a data strobe complement channel (DQSC) to data sink 102. A corresponding data signal propagates over a data channel (DQ). The electrical lengths of the data channel as well the true and complement data strobe channels is such that they may be treated as transmission lines having a characteristic impedance. To prevent reflections on these transmission lines, data receiver 102 includes on-die terminations each having an impedance that matches the characteristic impedance of the corresponding transmission lines. In particular, the DQST strobe channel ends in a termination 100, the DQSC strobe channel ends in a termination 105, and the DQ strobe channel ends in a termination 110. It is conventional that the DQSC, DQST, and DQ channels all have the same characteristic impedance and electrical length. In that regard, terminations 100, 105, and 110 all have a corresponding matching resistor R in parallel with a capacitor C that matches the termination impedances to the characteristic impedance for their corresponding channels. To further match the channels, a true data strobe driver 115, a complement data strobe driver 120, and a data driver 125 are all matching single-ended drivers comprising an inverter formed from a PMOS transistor P1 and an NMOS transistor M1.

System 10 works well at lower data rates. But as data rates are increased, power consumption goes up and the matching of the channels becomes more problematic. Accordingly, there is a need in the art for improved source-synchronous system architectures.

SUMMARY

A source-synchronous system is provided with non-uniform interfaces to the data strobe and data channels. The source-synchronous system includes both a data source endpoint and a data sink endpoint. At least one data strobe channel couples between the data source endpoint and the data sink endpoint. Similarly, at least one data channel couples between the data source endpoint and the data sink endpoint.

For the data source endpoint, the non-uniform interface relates to a mismatch between a data strobe driver for driving the data strobe channels and a data driver for driving the data channel. In one embodiment, the data strobe driver may comprise a differential driver whereas the data driver may comprise a single-ended driver.

The non-uniform interface in the data sink endpoint relates to a mismatch between the terminations for the data strobe and data channels. In one embodiment, the data strobe terminations may be capacitive terminations that are not matched to a resistive impedance for the data strobe channels. In contrast, the data channel terminations may each comprise a resistive termination that matches a resistive impedance for the data channels.

The non-uniform interfaces are quite advantageous. For example, substantial power is saved by using on-die capacitive terminations for the data strobe channels. In contrast, the on-die data resistive channel terminations match the impedance of the data channels. Data signals are thus not reflected yet power is saved by the elimination of matching resistive terminations for the data strobe channels. In addition, larger eyes are produced for the true and complement data strobe channels through the use of a differential driver. These and other advantageous features may be better appreciated through the following detailed description.

BRIEF DESCRIPTION OF THE DRAWINGS

Embodiments of the disclosed source-synchronous endpoints and their advantages are best understood by referring to the detailed description that follows. It should be appreciated that like reference numerals are used to identify like elements illustrated in one or more of the figures.

DETAILED DESCRIPTION

A source synchronous system is provided having a non-uniform interface with regard to the data strobe and data channels that couple between a data source endpoint and a data sink endpoint. For the data source endpoint, the non-uniform interface may relate to the drivers for the data strobe channels and for the data channels. For example the data strobe driver may be a differential data strobe driver whereas the data drivers may be single-ended drivers. Another non-uniformity between the drivers may relate to their power networks. The power and ground network for the data strobe driver may be independent from the power network for the data drivers.

In the channels, the non-uniformity may comprise the use of distinct metal layers for the data strobe channels as compared to a metal layer used for the data channels. In the data sink endpoint, the non-uniformity may relate to the on-die terminations for the data strobe and data channels. The data channels end in corresponding on-die resistive terminations in the data sink that have an impedance matching the resistive characteristic impedance of the data channels as is conventionally practiced. This resistive characteristic impedance depends upon the data channel design. For example, it may be 50Ω, or 120Ω, and so on depending upon the particular requirements for a given implementation. In contrast, the data strobe channels (or channel in single-data-rate embodiments) end in corresponding capacitive terminations that have an impedance that does not match the resistive characteristic impedance for the data strobe channels. By eliminating the resistive terminations that are conventionally used for the data strobe channels, substantial power savings are realized in that resistive terminations have an ohmic loss associated with them.

Figure 2:
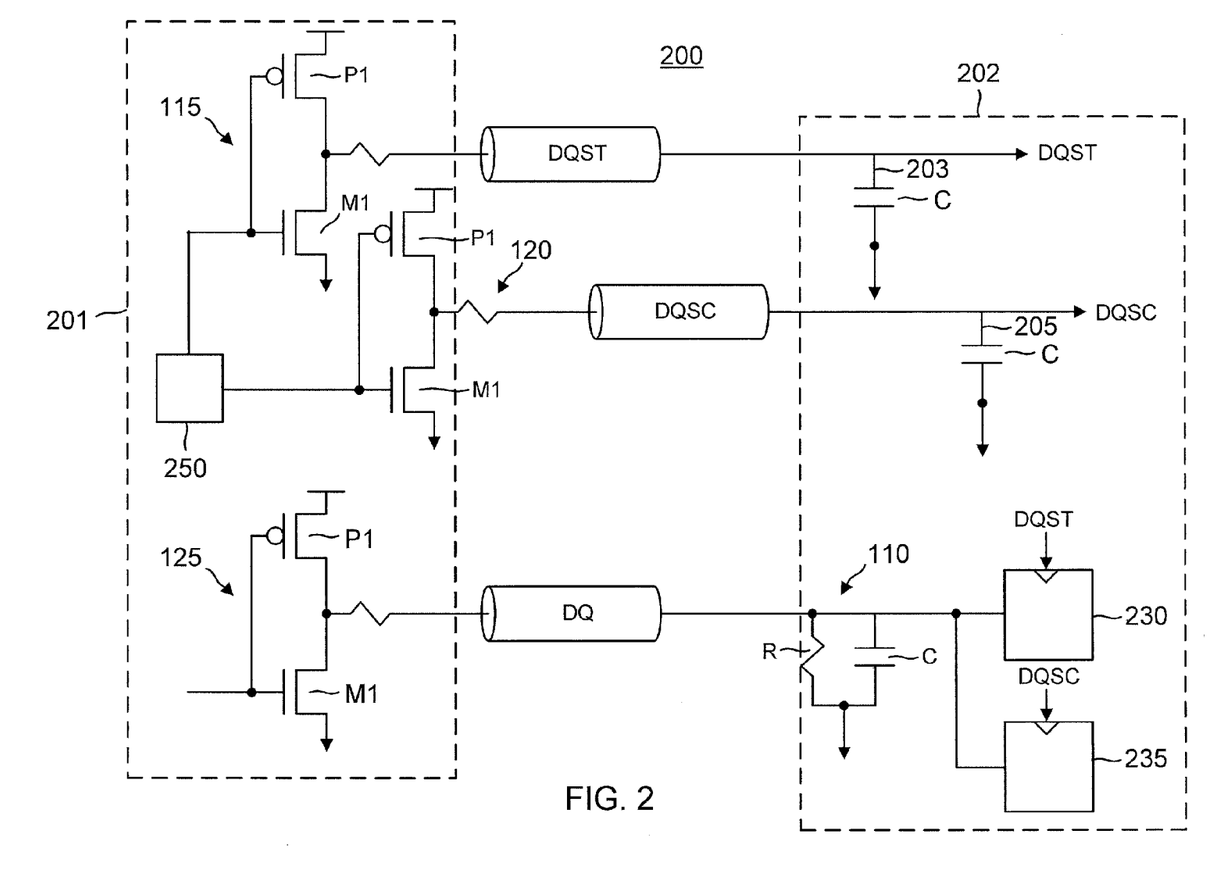
FIG. 2 is a circuit diagram of a source-synchronous system in which the data sink endpoint includes mismatched terminations for the data strobe and data channels.

An example source-synchronous system 200 is shown in FIG. 2. A data source endpoint 201 such as an SOC or other suitable integrated circuit operates analogously as discussed with regard to data source 101 of FIG. 1 in that data source 201 includes single-ended data strobe drivers 115 and 120 that are matched to data driver 125. Each single-ended driver comprises an inverter formed from a PMOS transistor P1 in series an NMOS transistor M1. Data strobe driver 115 drives a data strobe true channel (DQST). Similarly, data strobe driver 120 drives a data strobe complement channel (DQSC). In addition, data driver 125 drives a data (DQ) channel. In some embodiments, the DQ channel carries a single binary data signal. In other embodiments, the DQ channel may be part of a series of such channels as used in multi-wire coding. In yet other embodiments, the data transmission over the DQ channel may be multi-level instead of just binary.

A data sink 202 such as a dynamic random access memory (DRAM) integrated circuit receives the true and complement data strobe channels DQST and DQSC as well as the data channel DQ. The data channel DQ ends in an on-die resistive termination 110 formed such as by using a termination resistor R in parallel with a termination capacitor C. Resistive termination 110 is configured to have a resistive impedance that matches a resistive impedance for the data channel DQ. A typical value for such a resistive impedance is 50 to 60 but it will be appreciated that the resistance may be higher or lower than these values in alternative embodiments. Because of the matching, there are no undesirable reflections in the propagation of a data signal from data source endpoint 201 over data channel DQ to data sink endpoint 202.

In contrast, the DQST channel ends in an on-die capacitive termination 203 formed from a capacitor C such that an impedance for capacitive termination 203 does not match a resistive impedance for the DQST channel. Similarly, the DQSC channel ends in an on-die capacitive termination 205 formed from a capacitor C. As with the DQ channel, a typical impedance for the DQST and DQSC channels may be 50 to 60Ω although alternative embodiments may have a higher or lower resistance. Because of the mismatch, there will thus be reflections of the true and complement data strobes at capacitive terminations 203 and 205, respectively. But note that the true and complement data strobes are regular, repeating signals. Their reflections will thus also be non-random and can be trained out. For example, data source endpoint 201 may include a variable delay circuit 250 that can adjust a variable delay between the true and complement data strobes as compared to the data signal. During a training phase, data source endpoint 201 may send a training vector over the DQ data channel to resistive termination 110. Data sink endpoint 202 includes a pair of registers 230 and 235 having their data inputs coupled to resistive termination 110. Register 230 is clocked by the true data strobe received at capacitive termination 203. Similarly, register 235 is clocked by the complement data strobe received at capacitive termination 205. By varying the delay through variable delay circuit 250, data source endpoint 201 may obtain the maximum data eye for the received training sequence in registers 230 and 235. It will be appreciated that source-synchronous system 200 is shown having just one bit-wide data channel DQ and corresponding registers 230 and 235 for illustration clarity in that multiple data channels and corresponding registers may be used for the reception of bit-wide data words synchronous to a true and complement data strobe. Moreover, the non-uniform interface disclosed herein is not limited to the transmission of binary data. Multi-level data transmission could also be accomplished using data channels that are terminated analogously as shown for source-synchronous system 200.

With regard to the transmission of training vectors, it will be appreciated that the low power double data rate 4 (LPDDR4) standard also teaches the use of a variable delay for the data strobes as compared to the data channels (note that one can delay the data rather than the data strobe in the embodiments disclosed herein). In the LPDDR4 standard, the received data strobes in the data sink endpoint are buffered whereas the received data is not. There is thus a timing mismatch between the received data strobes and the received data in an LPDDR4 data sink endpoint. Because of this explicit mismatch, the data strobe is skewed with respect to the data signals at the data latches by 200 ps to 800 ps. To account for this skew, the LPDDR4 includes periodic training sessions in which the data source sends a training vector as the data word. In this fashion, the skew is trained out and accounted for. But just like the conventional systems discussed earlier, the on-die terminations and drivers are matched in LPDDR4 systems. The disclosed source-synchronous with non-uniform interfaces exploit the explicit mismatch allowed in the LPDDR4 standard to achieve dramatic power savings and more robust data strobe generation.

Figure 3:
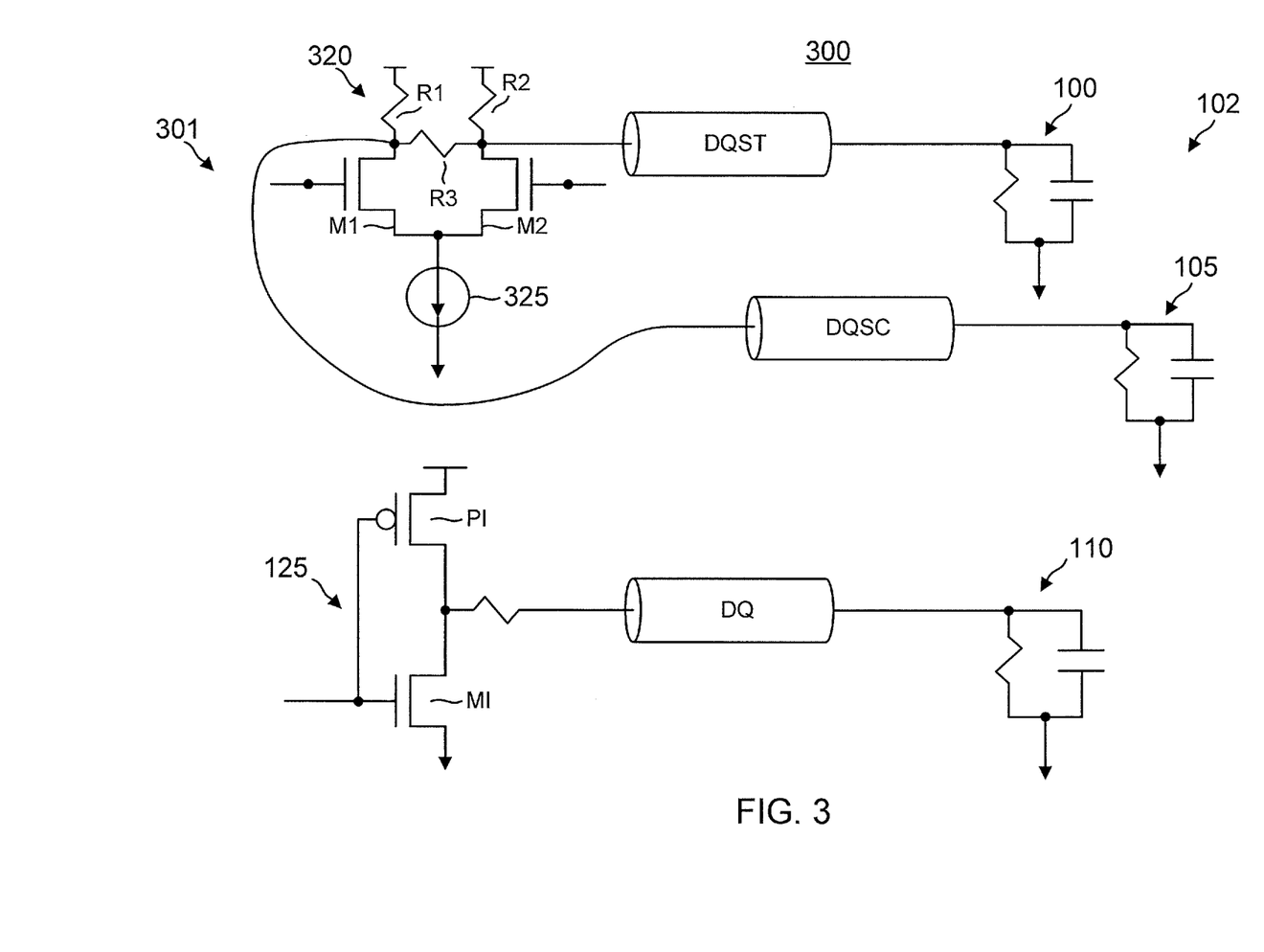
FIG. 3 is a circuit diagram of a source-synchronous system in which the data source endpoint includes a differential driver for the data strobe channels and a single-ended driver for the data channel.

The non-uniform interface with regard to the data channels and the data strobe channels may be extended to the drivers in data source endpoint 201. An example embodiment is shown for a source-synchronous system 300 in FIG. 3. A data source endpoint 301 drives the DQST, DQSC, and DQ channels analogously as discussed with regard to system 200 of FIG. 2. In addition, data sink endpoint 102 includes matched resistive terminations 100, 105, and 110 as discussed with regard to system 10 of FIG. 1. Similarly, single-ended data driver 125 in data source endpoint 301 endpoint drives data channel DQ analogously as discussed with regard to system 10. But matched single-ended drivers are not used to drive the DQST and DQSC data strobe channels. Instead, a differential driver 320 drives the true and complement data strobe channels. In particular, a pair of NMOS transistors M1 and M2 steer a bias current from a current source 325 responsive to a differential input voltage applied to the gates of transistors M1 and M2. The drain of transistor M1 couples to an input of the data strobe complement channel DQSC. Similarly, a drain of transistor M2 couples to an input of the data strobe true channel DQST. The drains of transistors M1 and M2 also couple to a power supply node through resistors R1 and R2, respectively. The drains of transistors M1 and M2 may be coupled together through a coupling resistor R3. As compared to the use of a single-ended driver, differential driver 320 produces a larger eye between the received true and complement data strobes at resistive terminations 100 and 105.

Figure 4:
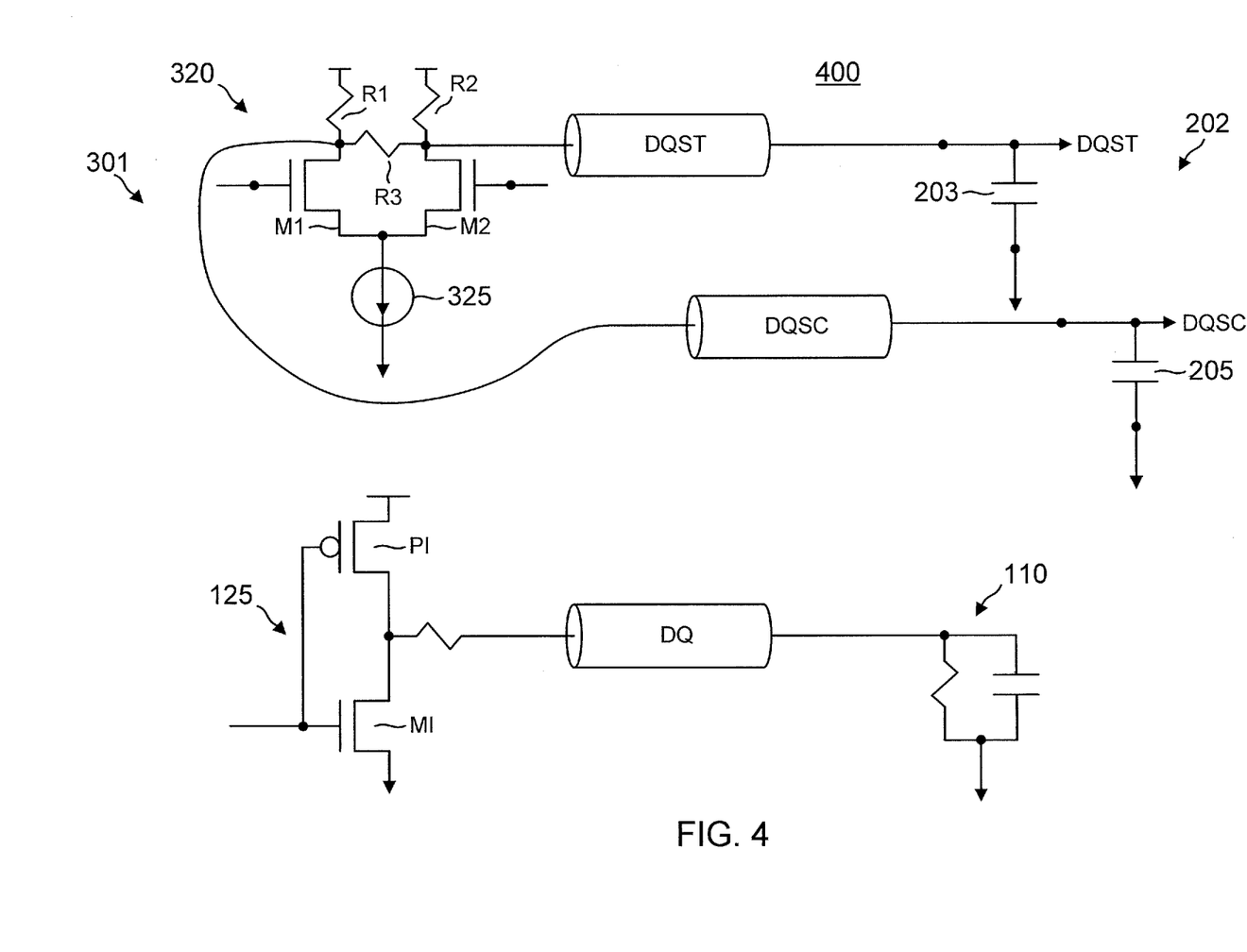
FIG. 4 is a circuit diagram of a source-synchronous system in which the data source endpoint includes a differential driver for the data strobe channels and a single-ended driver for the data channel and in which the data sink endpoint includes mismatched terminations for the data strobe and data channels.

In yet another alternative embodiment, both the drivers and the terminations may be mismatched. An example source-synchronous system 400 is shown in FIG. 4. System 400 combines data source endpoint 301 discussed with regard to system 300 with data sink endpoint 202 discussed with regard to system 200. For illustration clarity, registers 230 and 235 are not shown in FIG. 4.

Figure 5:
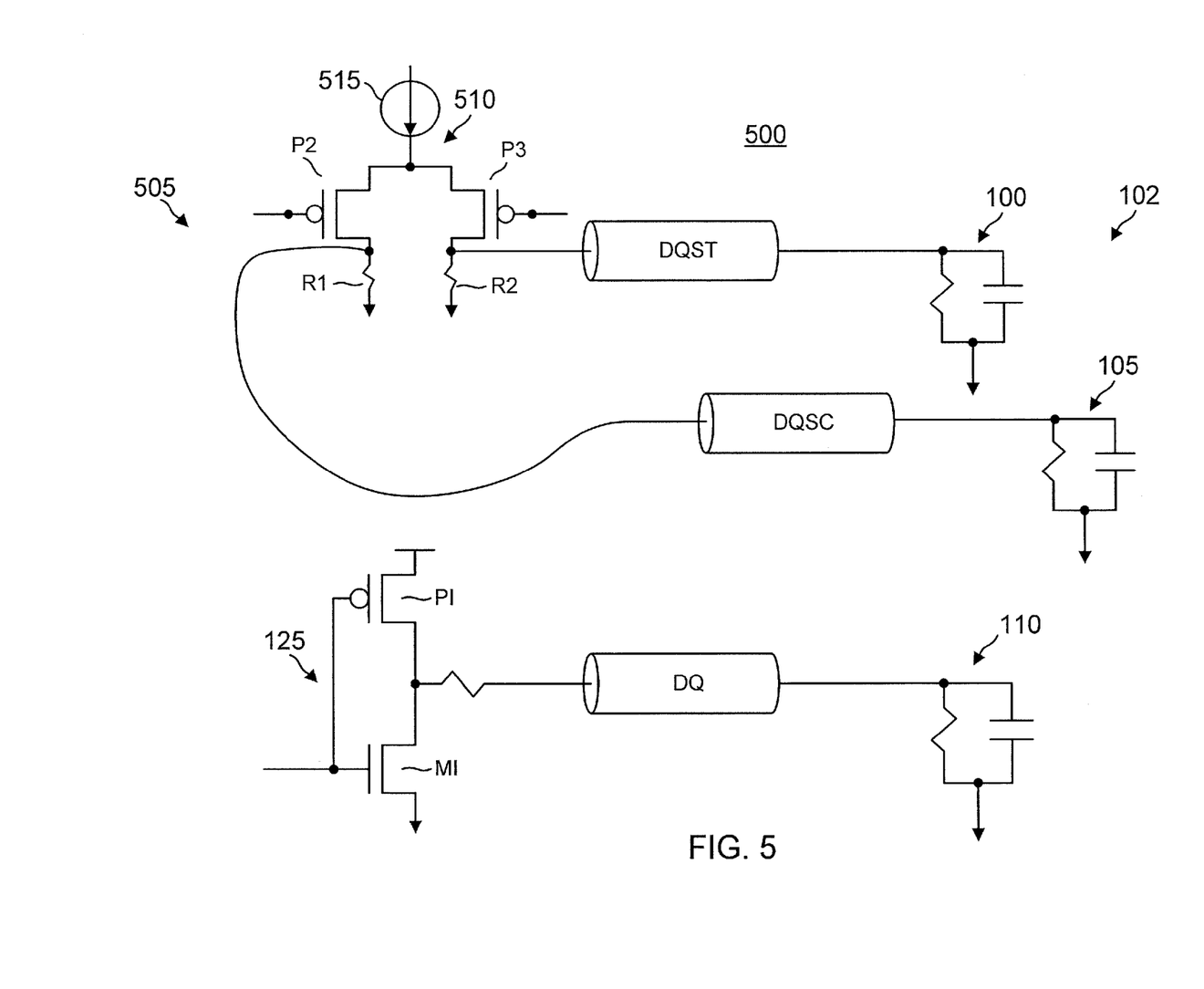
FIG. 5 illustrates a source-synchronous system including an alternative embodiment for the differential driver of FIG. 3.

Numerous alternative embodiments may be formed having mismatched drivers and/or terminations. For example, a source-synchronous system 500 shown in FIG. 5 includes a data sink endpoint 102 as discussed with regard to system 300. A data source endpoint 505 also includes a single-ended driver 125 for driving data channel DQ as discussed with regard to system 300. A differential driver 510 in data source endpoint 505 drives the true and complement data strobe channels DQST and DQSC. In contrast to differential driver 320 of FIG. 3, differential driver 510 shown in FIG. 5 includes a differential pair of PMOS transistors P2 and P3 having their drains coupled to ground through resistors R1 and R2, respectively. Transistors P2 and P3 steer a bias current from a current source 515 coupled to their sources responsive to a differential input voltage applied to their gates. The drain for transistor P2 couples to an input of the DQST data strobe channel. Similarly, the drain for transistor P3 couples to an input of the DQSC data strobe channel. In other embodiments, the capacitive terminations for the true and complement data strobe channels DQST and DQSC may be coupled to a power supply voltage through a weak pull-up resistor and/or coupled together through a coupling resistor (these resistors not matching the capacitive terminations to the resistive impedance of the data strobe channels).

Referring again to an embodiment in which the data sink endpoint comprises a DRAM integrated circuit, it will be appreciated that it is conventional for a data source endpoint to transmit a clock to the DRAM endpoint over a corresponding clock channel. The DRAM endpoint as disclosed herein may include an on-die capacitive termination for the clock channel analogous to capacitive terminations 203 and 205 as discussed for the data strobe channels DQST and DQSC. Such a capacitive endpoint for the clock channel saves additional power and increases the eye for the received clock at the data sink endpoint.

Figure 6:
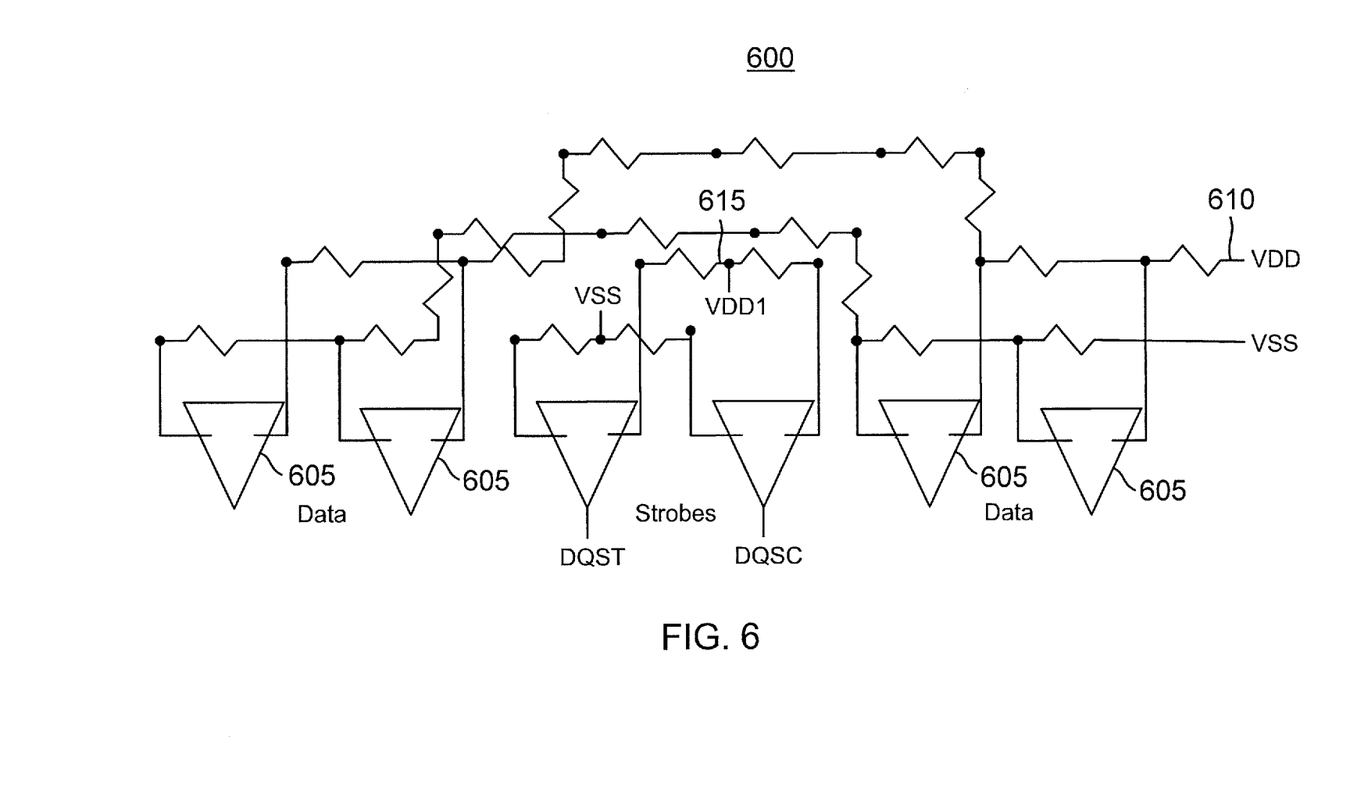
FIG. 6 illustrates separate ground and power networks for a data strobe driver and for data channel drivers.

Note only can the data strobe drivers be mismatched to the data drivers, but the power network supplying these drivers may be singulated from the power network for the data drivers. An example data source endpoint 600 is shown in FIG. 6 that includes a plurality of data drivers 605 all powered by a power supply node 610 providing a power supply voltage VDD with respect to ground VSS. An independent power supply node 615 provides a power supply voltage VDD1 for powering the data strobe drivers that drive the DQST and DQSC data strobe channels. In this fashion, the data strobe drivers are isolated from the random switching pattern of the data drivers 605. In addition, note that the data strobe channels DQST and DQSC as well as the data channel DQ are typically formed using patterned metal layers on a circuit board or other suitable propagation medium. Separate metal layers may be used for the data strobe channels to further isolate the data strobes from the random nature of the data transmission.

Figure 7:
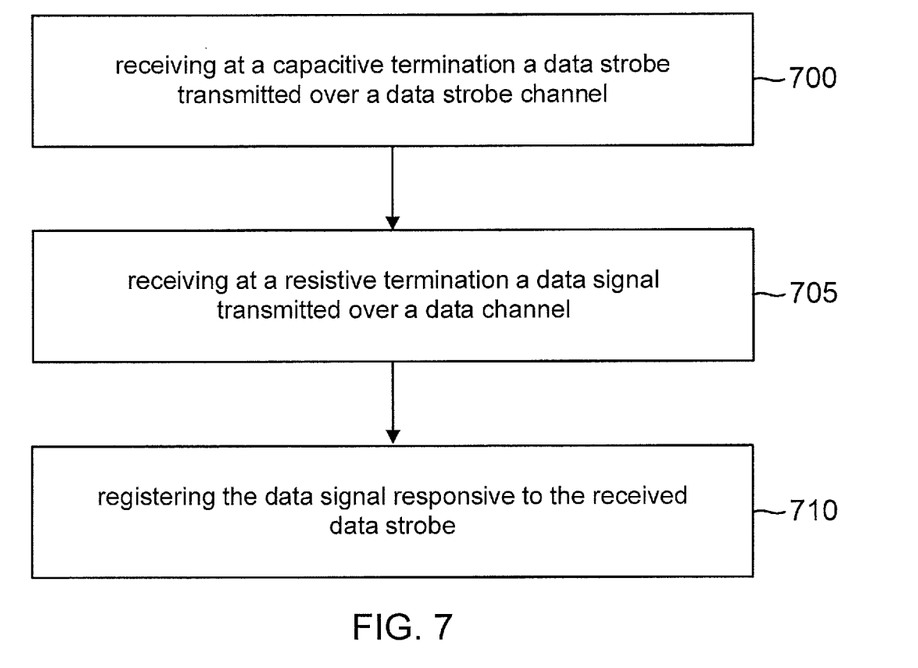
FIG. 7 is a flowchart of an example method of operation for a source-synchronous data sink endpoint having mismatched data strobe and data channel terminations.

A flowchart shown in FIG. 7 for an example method of operation for a source-synchronous system having non-uniform interfaces will now be discussed. A first act 700 comprises receiving at a capacitive termination a data strobe transmitted over a data strobe channel. An example of such an act is discussed above with regard to the reception at capacitive terminations 203 and 205. The method further comprises an act 705 of receiving at a resistive termination a data signal transmitted over a data channel. The reception of data at resistive termination 110 discussed above is an example of act 705. Finally, the method includes an act 710 of registering the data signal responsive to the received data strobe. An example of such an act is discussed above with regard to registers 230 and 235.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A source-synchronous data sink endpoint integrated circuit, comprising:
    a first on-die capacitive termination within the integrated circuit for a data strobe channel for receiving a data strobe from a second integrated circuit, the first capacitive termination having an impedance mismatched to a resistive impedance for the data strobe channel;
    an on-die resistive termination within the integrated circuit for a data channel for receiving a data signal from the second integrated circuit, the resistive termination having an impedance matching a resistive impedance for the data channel; and
    a first register configured to register the data signal received on the resistive termination, the first register having a clock input configured to be clocked by the data strobe received on the first capacitive termination.

2. The source-synchronous data sink endpoint integrated circuit of claim 1, wherein the data strobe channel is a true data strobe channel, the data sink endpoint further comprising a second capacitive termination for a complement data strobe channel, the second capacitive termination having an impedance mismatched to a resistive impedance for the complement data strobe channel.

3. The source-synchronous data sink endpoint integrated circuit of claim 2, further comprising a second register configured to register data received on the resistive termination, the second register having a clock input configured to be clocked by a complement data strobe received on the second capacitive termination.

4. The source-synchronous data sink endpoint integrated circuit of claim 2, wherein the first capacitive termination is coupled to the second capacitive termination through a coupling resistor.

5. The source-synchronous data sink endpoint integrated circuit of claim 1, wherein the source-synchronous data sink endpoint comprises a dynamic random access memory (DRAM) integrated circuit.

6. The source-synchronous data sink endpoint integrated circuit of claim 1, wherein the first capacitive termination is coupled to a power supply voltage node through a weak pull-up resistor.

7. The source-synchronous data sink endpoint integrated circuit of claim 1, wherein the resistive termination comprises a parallel combination of a resistor and a capacitor.

8. The source-synchronous endpoint integrated circuit of claim 1, further comprising a second capacitive termination for a clock channel, the second capacitive termination having an impedance that is mismatched with regard to a resistive impedance of the clock channel.

9. A method, comprising:
   in a first integrated circuit, receiving at a first capacitive termination a first data strobe transmitted over a first data strobe channel from a second integrated circuit;
   in the first integrated circuit, receiving at a resistive termination a data signal transmitted over a data channel from the second integrated circuit; and
   in the first integrated circuit, registering the data signal responsive to a clock edge in the received first data strobe.

10. The method of claim 9, further comprising receiving at a second capacitive termination a second data strobe transmitted over a second data strobe channel.

11. The method of claim 10, further comprising registering the data signal responsive to a clock edge in the received second data strobe.

12. The method of claim 9, further comprising receiving at a second capacitive termination a clock signal.

* * * * *